(12) United States Patent
Rudeck

(10) Patent No.: US 7,148,547 B2
(45) Date of Patent: Dec. 12, 2006

(54) SEMICONDUCTOR CONTACT DEVICE

(75) Inventor: Paul J. Rudeck, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 75 days.

(21) Appl. No.: 10/929,634

(22) Filed: Aug. 30, 2004

(65) Prior Publication Data

US 2005/0026350 A1    Feb. 3, 2005

Related U.S. Application Data

(62) Division of application No. 10/095,274, filed on Mar. 11, 2002.

(51) Int. Cl.
*H01L 29/76* (2006.01)
*H01L 29/94* (2006.01)
*H01L 31/062* (2006.01)
*H01L 31/113* (2006.01)
*H01L 31/119* (2006.01)

(52) U.S. Cl. .................. 257/390; 257/296; 257/208
(58) Field of Classification Search ................. 257/390
See application file for complete search history.

(56) References Cited

U.S. PATENT DOCUMENTS

| | | | | |
|---|---|---|---|---|
| 5,204,286 | A | 4/1993 | Doan | 437/195 |
| 5,858,877 | A | 1/1999 | Dennison et al. | 438/700 |
| 5,869,371 | A | 2/1999 | Blanchard | 438/268 |
| 5,907,781 | A | 5/1999 | Chen et al. | 438/303 |
| 5,990,507 | A * | 11/1999 | Mochizuki et al. | 257/295 |
| 6,037,223 | A | 3/2000 | Su et al. | 438/257 |
| 6,074,915 | A | 6/2000 | Chen et al. | 438/258 |
| 6,190,957 | B1 * | 2/2001 | Mochizuki et al. | 438/240 |
| 6,198,122 | B1 * | 3/2001 | Habu et al. | 257/296 |
| 6,221,779 | B1 | 4/2001 | Dennison et al. | 438/700 |
| 6,225,211 | B1 | 5/2001 | Tsui | 438/624 |
| 6,229,174 | B1 | 5/2001 | Parekh | 257/306 |
| 6,239,017 | B1 | 5/2001 | Lou et al. | |
| 6,258,714 | B1 | 7/2001 | Shrivastava | 438/638 |
| 6,501,115 | B1 * | 12/2002 | Yoshida et al. | 257/296 |
| 6,503,794 | B1 * | 1/2003 | Watanabe et al. | 438/253 |
| 6,548,343 | B1 * | 4/2003 | Summerfelt et al. | 438/240 |
| 6,593,654 | B1 | 7/2003 | Oyamatsu | |
| 6,717,267 | B1 | 4/2004 | Kunikiyo | |

(Continued)

OTHER PUBLICATIONS

"Dual-damascene challenges dielectric etch", *Cahners Smiconductor International*, 6 pages.

(Continued)

*Primary Examiner*—Evan Pert
*Assistant Examiner*—Victor A. Mandala, Jr.
(74) *Attorney, Agent, or Firm*—Schwegman, Lundberg, Woessner & Kluth, P.A.

(57) ABSTRACT

The invention provides an advanced metallization technique for fabricating a memory cell array on a substrate. The array is fabricated by forming discrete and self-aligned vias in a first layer disposed over the array to form contacts to each of the source and drain junction in the array. Further, self-aligned local area slotted vias are formed in a second layer that is disposed over the first layer to form local area interconnects that electrically shunt all of the source contacts/junctions. Further, discrete self-aligned drain extensions are formed over each of the formed drain contacts to electrically connect the junctions, and source contacts to the extensions. The formed vias, extensions, and slotted local area vias are simultaneously plugged and filled with a conductive material to form the memory cell array.

27 Claims, 11 Drawing Sheets

U.S. PATENT DOCUMENTS

| | | |
|---|---|---|
| 6,867,092 B1 | 3/2005 | Uchiyama et al. |
| 2003/0008450 A1 | 1/2003 | Tsai et al. ................... 438/200 |
| 2003/0080416 A1 | 5/2003 | Jorger et al. ................ 257/734 |
| 2004/0084732 A1 | 5/2004 | Hsieh ......................... 257/390 |

OTHER PUBLICATIONS

Qiao, Jianmin, et al., "Development of self-aligned contact technology", *Cypress Semiconductor, San Jose, CA*, (1999), 2373-2377.

* cited by examiner

SEMICONDUCTOR CONTACT DEVICE

This application is a Divisional of U.S. application Ser. No. 10/095,274, filed Mar. 11, 2002 which is incorporated herein by reference.

FIELD OF THE INVENTION

The present invention relates to fabrication of integrated circuits and, in particular, to fabrication of memory array logic devices requiring both self-aligned contact structures and local area interconnects.

BACKGROUND OF THE INVENTION

Contacts are required in an integrated circuit device to provide electrical connections between layers or levels of the integrated circuit device. Semiconductor devices typically include a multitude of transistors, which are coupled together in particular configurations through the use of contacts.

A conventional flash memory module includes multiple memory cells. A memory cell includes a stacked gate, a drain, and a source. A drain contact electrically connects the drain of each memory cell to a conductive layer (a bit line) above the stacked gate. The conductive layer can be a aluminum layer. For a NOR type of memory array, a common/single source contact connects the source junctions of a number of memory cells. This common source contact is generally referred to as a "source rail."

There is increasing pressure in the current semiconductor industry to achieve higher device density within a given die area. This is particularly true in memory circuit fabrication, such as a flash memory manufacture. In recent years, the number and density of these memory cells on the flash memory module has dramatically increased so that the number of memory cells on a single chip is expected to soon reach 1 Gigabit. Increases in semiconductor packing density and downsizing of individual devices has resulted in increases in circuit density. Many aspects of the semiconductor fabrication process are affected by the demand for density increases in device packing. Feature alignment from one semiconductor level to the next is of critical importance, particularly relating to the alignment of contact holes with the underlying structures with which they are to connect, such as active areas. Device miniaturization complicates the process of forming interconnect structures because in order to maintain sufficient electrical communication, the interconnect structure must be formed in exact alignment with an underlying active region. At the same time, the area of the interconnect structure interfacing with the active area must be maximized. Thus, as device sizes shrink there is less room for misalignment errors of the interconnect structure.

Device size reductions are due in part to advances in photolithography and directional (anisotropic) plasma etching. Because horizontal device feature sizes are approaching deep submicrometer dimensions, self-alignment techniques are employed to relax the alignment requirements and improve critical dimension (CD) control. One such self-alignment technique is called self-aligned contact (SAC) etching. In SAC etching, a pair of adjacent gate stacks are utilized to align an etched opening in an insulating layer.

Currently there are possible options for a flash memory module to utilize the self-aligned contact process. The first option is to limit the SAC process to the current location for making contact to both the source and the drain junctions. In this case, a scaled process would still be limited by high source rail resistance and/or excess source junction overlap with the gate stack.

The second option would be to merge a local area interconnect and the SAC process together. The problem with this option being is that you have to etch both a long slotted contact over the source junctions and discrete round contacts over the drain junctions. Etching of the SAC contact is generally very shape sensitive and etching of such multiple shapes during the self-aligned contact process can result in significant etch problems and self-aligned contact problems. In addition, the long slotted contact would be passing over both active junction regions and field isolation regions. The etch would ideally have to be selective to field isolation. This is somewhat difficult, because the material used for the field isolation and the undoped glass, under the borophosphosilicate glass (BPSG) are very similar.

The third possible option is to limit the SAC etch contact to one size only, all having a discrete round pattern. The problem with this approach is that the source contacts are not linked together and an additional shunting layer must be patterned (resulting in a second lithography level), etched (resulting in a second etch step), and formed for the source junctions (resulting in a second metal deposition and chemical-mechanical polishing (CMP)).

As device sizes are reduced, smaller dimensions are required to achieve higher packing densities. The spacing between the contacts and the gate can significantly contribute to the overall size of the flash memory cell. Simply reducing the space between the contacts and the gate makes the fabrication process less robust, more complex for the lithography process, and less cost effective due to yield loss resulting from alignment errors.

Thus, there is a need in the art to relax contact-to-gate spacing, making the SAC contact a requirement. In addition, there is a need for a flash memory with a smaller cell channel length, which will require the use of a local interconnect. Further still, there is an overall need to reduce the cost of the process flow, which in combination with all of the above, requires the memory cell fabrication process to be more robust, less complex, and more cost effective.

SUMMARY OF THE INVENTION

The present invention provides an advanced metallization technique for fabricating a flash memory cell array on a substrate to reduce cell size and make the fabrication process more robust, less complex, and more cost effective.

The array is fabricated by forming discrete and substantially similarly sized self-aligned contacts in a first layer disposed over the array to form contacts to each of the source and drain junctions in the array. Further, self-aligned local area slotted vias in a second layer disposed over the first layer form local area interconnects that electrically shunt all of the source contacts/junctions. In addition, discrete self-aligned drain extensions are formed over each of the formed drain contacts. Plugging and filling the formed self-aligned contacts, drain extensions, and the slotted local area vias with a conductive material is performed in a single step to form the array including the discrete self-aligned drain contacts and local area interconnects shunting the source junctions in each of the rows in the array.

Additional advantages and features of the present invention will be more apparent from the detailed description and accompanying drawings, which illustrate preferred embodiments of the invention.

DETAILED DESCRIPTION OF THE INVENTION

Figure 1:
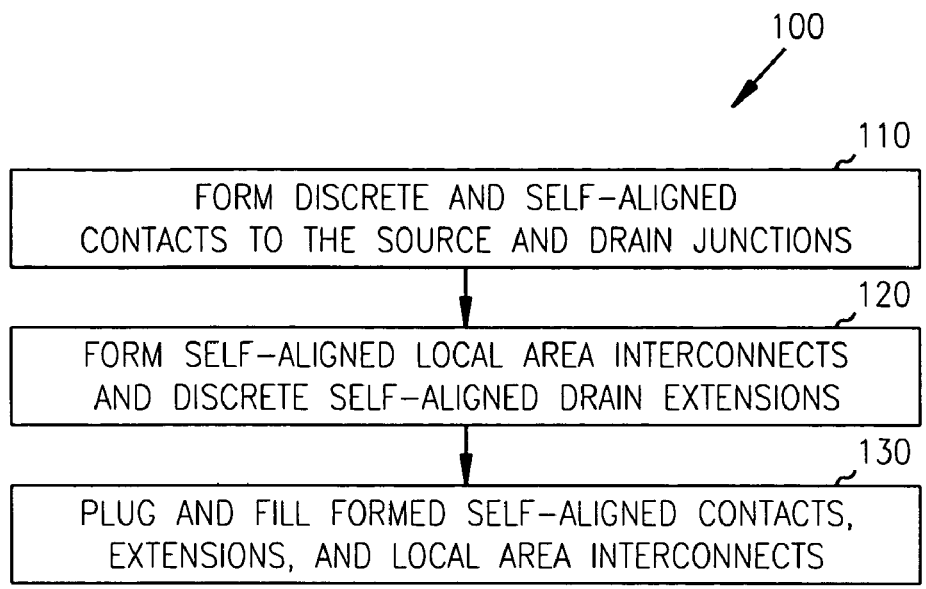
FIG. 1 is a flow diagram of fabricating a memory array according to the present invention.

In the following detailed description, reference is made to various specific embodiments in which the invention may be practiced. These embodiments are described with sufficient detail to enable those skilled in the art to practice the invention, and it is to be understood that other embodiments may be employed, and that structural, logical, electrical, and process changes may be made without departing from the teachings of the invention.

In the foregoing description of the preferred embodiments, various features of the invention are grouped together in a single embodiment for the purpose of streamlining the disclosure. This method of disclosure is not to be interpreted as reflecting an intention that the claimed invention requires more features than are expressly recited in each claim. Rather, as the following claims reflect, inventive aspects lie in less than all features of a single disclosed embodiment. Thus, the following claims are hereby incorporated into the description of the preferred embodiments, with each claim standing on its own as a separate preferred embodiment of the invention.

The term "substrate" used in the following description may include any semiconductor-based structure that has an exposed silicon surface. Structure must be understood to include silicon-on insulator (SOI), silicon-on sapphire (SOS), doped and undoped semiconductors, epitaxial layers of silicon supported by a base semiconductor foundation, and other semiconductor structures. The semiconductor need not be silicon-based. The semiconductor could be silicon carbide, silicon-germanium, germanium, or gallium arsenide. When reference is made to a wafer or substrate in the following description, previous process steps may be utilized to form regions, junctions, or layers in or on the base semiconductor or foundation.

In the discussion which follows, the invention is described with reference to a self-aligned contact etch as used in the fabrication of memory devices. However, it should be understood that the invention pertains to any applications which require selectivity to an undoped oxide isolation region during the etch of doped silicon oxide dielectric layers.

The present invention provides a technique for fabricating a memory cell array on a substrate to reduce cell size and to make the fabrication process more robust, less complex, and more cost effective.

The fabrication technique includes forming discrete and self-aligned contacts to each of the source and drain junctions in the memory cell array disposed on a semiconductor substrate. The technique further includes forming self-aligned local area interconnects to form a common source region between each of the cells within each of the rows, in the array to reduce the possibility that the formed contacts will touch the gate structures of the memory cell array, and thereby significantly reducing the chances of shorting the gate structures. Finally, the formed contacts and interconnects are plugged and filled with a conductive material to form the memory cell array.

The fabrication technique of the present invention uses self-aligned contact structures and local area interconnects to relax contact-to-gate spacing requirements to reduce the cell size and to further enhance the robustness of the fabrication process of the memory cell array. The technique allows forming discrete and similarly sized contacts to both the source and drain regions, which makes the SAC process more controllable and repeatable, thereby enhancing the robustness of the fabrication of the array.

The technique further forms a shunt layer for the source junctions and contact extensions for the drain contacts, and further allows for a self-aligned via to contact process. The advantage of using such local area interconnects, is that the source rail resistance is no longer dependant on the doping profile of the source junction. This allows doping of the source junction to be scaled back, leading to more aggressive scaling of the channel length. In addition, since source rail resistance can be greatly reduced, there is no longer a need to include a source contact for every 16 cells. The number of source contacts, per row within a block, can now be scaled back to only two. There is one contact at the right edge of each block and one contact at the left edge of each block.

Also, the technique requires only one doped oxide etch for forming all of the SAC and non-SAC contacts, the shunt layer and the contact extensions. In addition, the technique requires only one metal stack deposition and one CMP to fill all of the SAC and non-SAC contacts, the shunt layer, and the contact extensions. This leads to a smaller flash cell/array due to a reduced contact-to-gate area (because of the use of SAC contact), and source junction scaling (reduced channel length due to the use of local area interconnect). Further, this technique leads to a lower cost because the doped oxide etch and the single step metal deposition/CMP processes are combined into one single process step. This technique further results in improving the wafer/die yield due to forming substantially similarly sized contacts, which results in a more controlled and repeatable SAC process.

Referring now to FIG. 1, a representative flow diagram 100 according to the present invention. Exemplary flow diagram 100 includes blocks 110–130 that illustrate fabricating a memory cell array on a substrate. The array includes memory cells arranged in rows and columns. Each of the memory cells in the array includes a stacked gate, a source, and a drain. Further, each source and drain in the array includes corresponding source and drain junctions. In some embodiments, the memory cell array can be a flash memory cell array, a memory circuit including an array of memory cells disposed on a substrate and/or a logic circuit including an array of memory cells.

Block 110 includes forming discrete and substantially similarly sized self-aligned source and drain contacts in a first layer disposed over the array to each of the source and drain junctions in the array.

Block 120 includes forming self-aligned local area slotted vias in a second layer disposed over the first layer. Each of the self-aligned local area slotted vias form local area interconnects that electrically shunt all of the source junction to the cells in each of the rows in the array. Further, block 120 includes forming discrete self-aligned drain extension over each of the formed self-aligned drain contacts to electrically connect the drains junctions to the drain extensions.

Block 130 includes simultaneously plugging and filling each of the formed self-aligned contacts, drain extensions, and slotted vias with a conductive material to form the memory cell array. The fabricated memory cell array includes self-aligned drain contacts and slotted local area interconnects that electrically shunt all of the source junctions.

Figure 2:
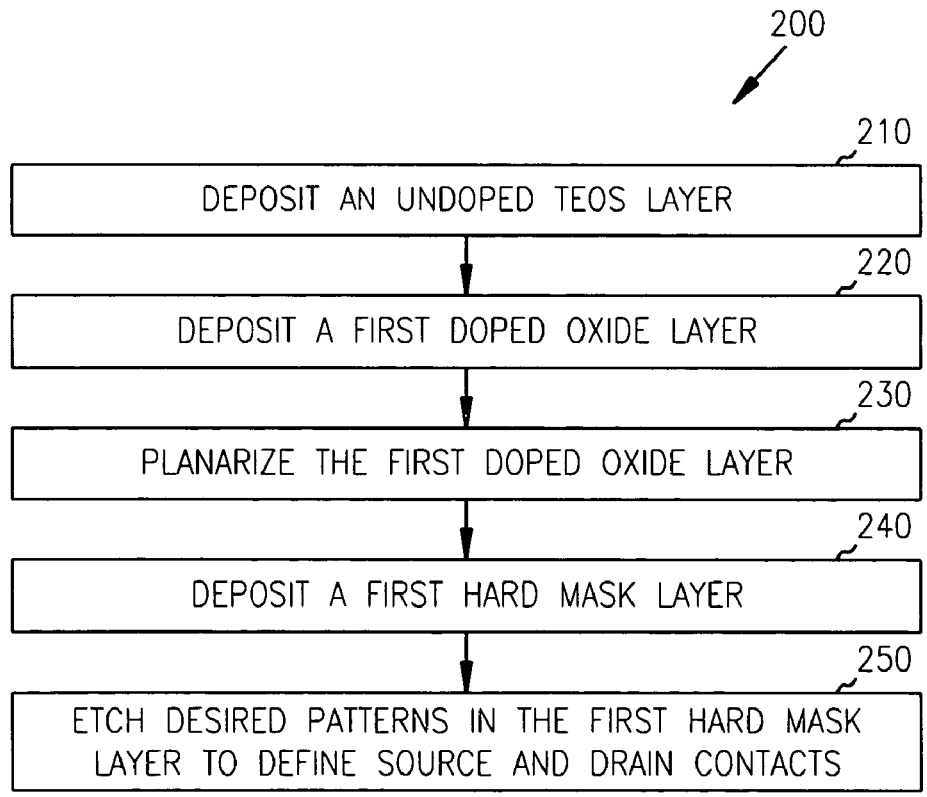
FIG. 2 is a flow diagram of one exemplary method of forming self-aligned contacts of a flash memory array fabricated according to the present invention.

FIG. 2 is a flow diagram 200 of one exemplary method of forming discrete and similarly sized self-aligned source and drains contacts in the first layer of the memory cell array shown in FIG. 1. Exemplary flow diagram 200 includes blocks 210–250. Block 210 includes depositing an undoped TEOS CVD oxide (tetraethylorthosilicate Si $(OC_2H_5)_4$) layer over the memory cell array. The thickness of the undoped TEOS CVD oxide layer can be in the range of about 200–500 Angstroms. The memory cell array is formed on a substrate. The substrate can be formed from monocrystalline silicon material.

Block 220 includes depositing a first doped oxide layer such that the deposited first doped oxide layer is deposited over the deposited TEOS CVD oxide layer such that the first doped oxide layer fills unfilled portions around each of the source and the drain in the array and further the deposed first doped oxide layer is higher than the stacked gate. In some embodiments, the first doped oxide layer is deposited using materials such as BPSG (borophosilicate glass), BSG (borosilicate glass), and/or PSG (phosphosilicate glass). The thickness of the first doped oxide layer can be in the range of about 5,000–18,000 Angstroms.

Block 230 includes planarizing to remove the excess deposited first doped oxide layer such that the first doped oxide layer is in the same plane as the top of the stacked gate. In some embodiments, planarizing is done using processes such as a chemical-mechanical polishing process. In some embodiments, planarizing includes removing the excess first doped oxide layer such that the first doped oxide layer stops on the nitride cap layer. Generally, the top of the stacked gate includes a desired nitride cap layer.

Block 240 includes depositing a first hard mask layer over the planarized first doped oxide layer and the top of the stacked gate. In some embodiments, the first hard mask layer can be deposited using nitride. The thickness of the first hard mask layer can be in the range of about 200 to 1500 Angstroms.

Block 250 includes etching desired patterns in the first hard mask layer to define the shape and position of each of the self-aligned contacts for the source, drain, and gate stack regions. Etching of the first hard mask layer is performed such that it stops on the deposited first doped oxide layer to form the source and drain contacts. In some embodiments, etching desired patterns in the first hard mask layer is performed by first masking the first hard mask layer to provide exposed etching patterns on top of the first hard mask layer to receive the self-aligned contacts over the source and the drain junctions. Then etching the exposed etching patterns in the first hard mask layer to receive self-aligned contacts over source and drain junctions by stopping the etching on the deposited doped oxide layer.

Figure 3:
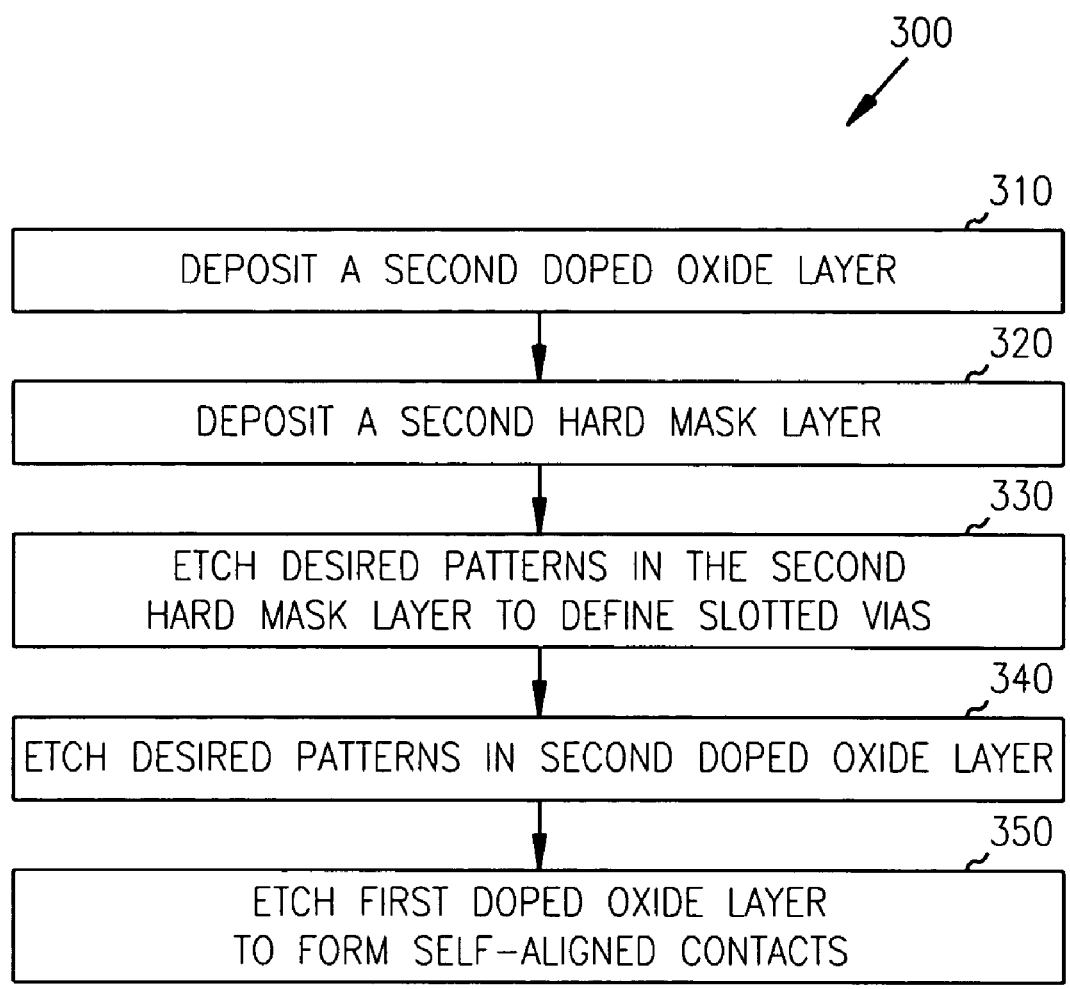
FIG. 3 is a flow diagram of one exemplary method of forming self-aligned local area slotted vias according to the present invention.

FIG. 3 is a flow diagram 300 of one exemplary method of forming self-aligned local area slotted vias in a second layer disposed over the first layer to form local area interconnects. Each of the formed local area interconnects electrically shunt all of the source junctions through the formed source contacts of the cells in each of the rows in the array. Further the method includes forming discrete self-aligned extensions over each of the formed self-aligned drain contacts to electrically connect the drain junctions through the drain contacts to the extensions. Exemplary flow diagram 300 includes blocks 310–350.

Block 310 includes depositing a second doped oxide layer over the deposited first hard mask layer and the etched patterns. In some embodiments, the second doped oxide layer is deposited using materials such as BPSG (borophosphosilicate glass), BSG, and/or PSG. The thickness of the second doped oxide layer can be in the range of about 2,000–6,000 Angstroms.

Block 320 includes depositing a second hard mask layer over the deposited second doped oxide layer. In some embodiments, the first hard mask layer can be deposited using nitride. The thickness of the first hard mask layer can be in the range of about 200 to 1500 Angstroms.

Block 330 includes etching desired patterns in the second hard mask layer to define the shape and position of each of the self-aligned local area slotted vias that form local area interconnects to electrically shunt all of the source junctions through the source contacts in each row in the array. In some embodiments, etching the desired patterns in the second hard mask layer includes masking the second hard mask layer to expose the patterns for the slotted vias to receive long bar contacts that electrically shunt all of the source junctions and the discrete extensions over each of the formed discrete contacts and poly contacts. Block 340 includes etching the exposed patterns in the underlying second doped oxide layer. In some embodiments, exposed patterns are etched using an oxide etch that is selective to nitride to obtain desired patterns in the second doped oxide layer. Block 350 includes further etching patterns defined by the patterns in the first hard mask layer in the first doped oxide layer to form the initial self-aligned contacts to the junctions. Etching the first and second doped oxide layers is performed under a self-aligned contact etch process using both the patterned hard masks and the nitride spacers along the cell's sidewalls, to guide, or self-align the etch process. In some embodiments, the self-aligned local area interconnects are formed using a dual damascene process. In some embodiments, the first doped oxide layer is etched with an oxide etch that is selective to nitride to form the self-aligned contacts.

Figure 4:
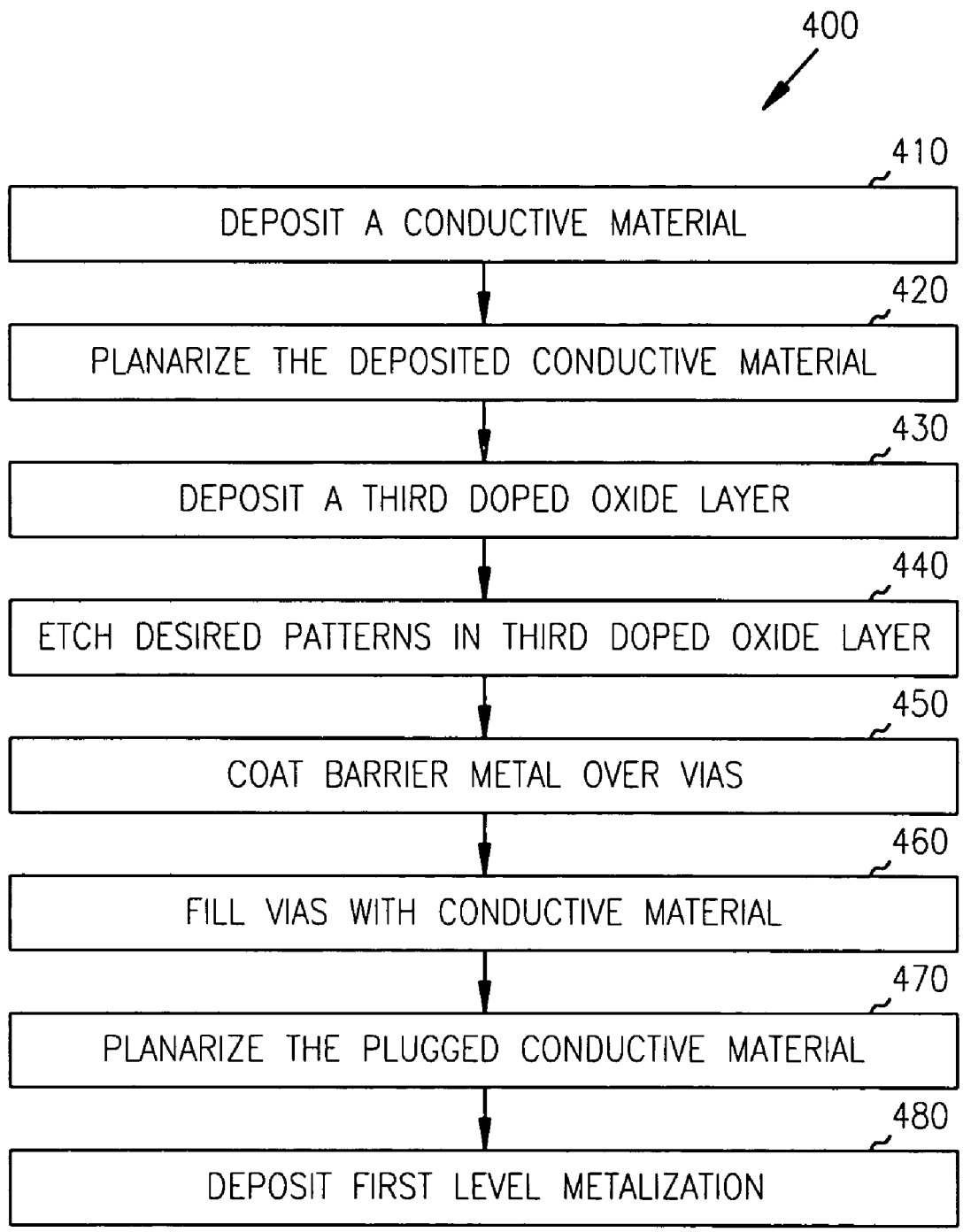
FIG. 4 is a flow diagram of another exemplary method of forming the memory array by using the formed contacts and vias as illustrated in FIGS. 2 and 3 according to the present invention.

FIG. 4 is a flow diagram 400 of another exemplary method of forming the memory array by plugging and filling the formed contacts and slotted vias with a conductive material, as described with reference to FIGS. 2 and 3. Exemplary flow diagram 400 includes blocks 410–480. Block 410 includes depositing a conductive material in the formed self-aligned contacts and slotted vias. Filling the discrete contacts and the slotted vias with a conductive material is accomplished in one single step, thereby eliminating the need to plug and fill the conductive material in two separate steps for the first and second layers of the array. The conductive material used in plugging and filling the formed contacts and vias, include, for example, tungsten, aluminum, copper, titanium, tantalum, cobalt, molybdenum, tungsten silicide, titanium silicide, tantalum silicide, cobalt silicide, molybdenum silicide, and/or any combination of the above films.

Block 420 includes planarizing the deposited conductive material to the second hard mask layer by removing any excess conductive material deposited during the plugging and filling process described above. Planarizing the conductive material can be accomplished using techniques such as a chemical-mechanical polishing and/or a plug etch-back process.

Block 430 includes depositing a third doped oxide layer over the planarized conductive material and the deposited second hard mask layer. In some embodiments, the third doped oxide layer is deposited using materials such as BPSG (borophosphosilicate glass), BSG, and/or PSG. The thickness of the third doped oxide layer can be in the range of about 2,000–6,000 Angstroms.

Block 440 includes etching desired patterns in the third doped oxide layer such that the patterns opens up discrete vias to the underlying discrete extensions and contacts connecting to the drain junctions and shunt layer, as well as contacts to the gate stack. Block 450 includes coating a thin layer of barrier metal over the opened drain vias in the third doped oxide layer. For example, for tungsten plug or aluminum plug, barrier metal can be titanium followed by titanium nitride (Ti/TiN) and for copper plug the barrier metal can tantalum nitride (TaN).

Block 460 includes filling the coated drain vias with a conductive material to electrically connect with the exposed discrete extensions in the second doped oxide layer. The conductive material used in filling the drain vias can include tungsten, aluminum, copper, titanium, tantalum, cobalt, molybdenum, tungsten silicide, titanium silicide, tantalum silicide, cobalt silicide, and/or molybdenum silicide.

Block 470 includes planarizing the plugged drain vias to remove any excess deposited conductive material to be in plane with outer exposed third doped oxide layer. Block 480 includes depositing a first level metallization on the outer exposed third doped oxide layer to electrically connect all established discrete drain contacts in the array.

Figure 5:
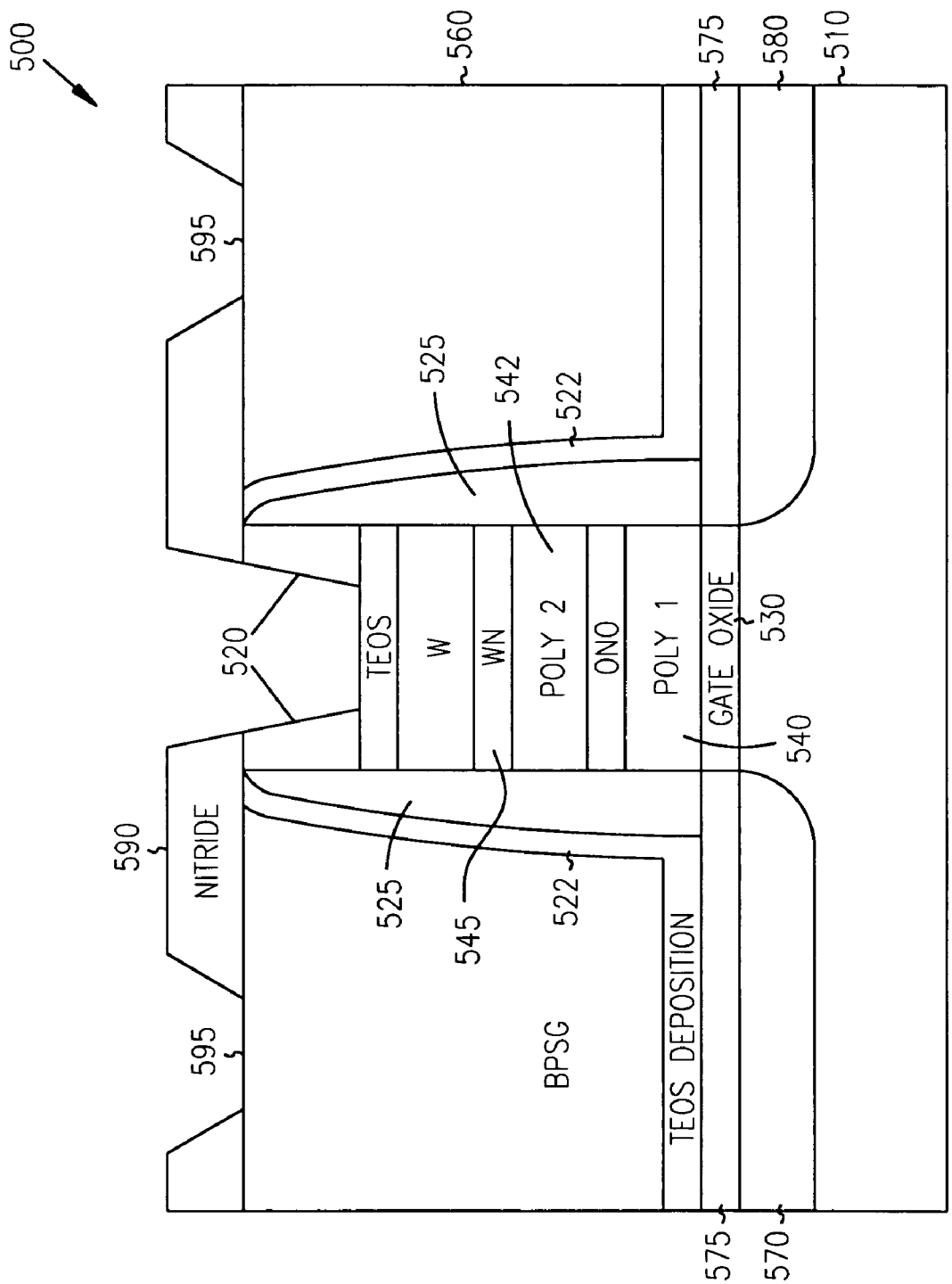
FIG. 5 is a cross-sectional view of a portion of a flash memory cell fabricated by using some of the steps illustrated in FIG. 2.

FIGS. 5–9 show the memory cell structure 500 in the processing state shown in FIGS. 1, 2, 3, and 4. The memory cell structure 500 shown in FIG. 5 includes a substrate 510 having a gate stack 520 of a memory cell formed according to well-known semiconductor processing techniques. For simiplicity and a better understanding of the memory cell structure, only one gate stack is shown in FIG. 5, it can be envisioned that the substrate includes an array of memory cells including similar gate stacks.

FIG. 5 illustrates the formed discrete and substantially similarly sized self-aligned contacts in the first hard mask layer 590 over the memory cell structure 500. The gate stack 520 shown in FIG. 5, includes an oxide layer 530, an electrically insulated conductive layer 540, such as poly-silicon, and a high coupling dielectric cell stack including oxide-nitride-oxide, a second poly-silicon layer 542, which is typically directly layered to a metal shunt layer, nitride spacers 525, and a nitride cap 550. The shunt metal layer could be formed using either a pure metal such as tungsten/tungsten nitride or a refractory metal silicide layer 545. A refractory metal silicide layer may comprise any refractory metal, including but not limited to, titanium, tungsten, cobalt, tantalum, and molybdenum. Preferably, the refractory metal silicide layer is substantially composed of tungsten silicide ($WSi_x$). A TEOS (tetraethylorthosilicate) layer is formed over nitride spacers 525.

An insulating oxide layer 560, for example a borophosphosilicate glass (BPSG), borosilicate glass (BSG), and/or phosphosilicate glass (PSG) layer, covers the substrate 510, which contains the gate stack 520 and active regions. Also shown in FIG. 5 are source and drain junctions 570 and 580, respectively of the memory cell structure 500. In some embodiments, a thermal oxide layer 575 is formed over the drain and source junctions 570 and 580, respectively.

The processing state shown in FIG. 5 includes a first hard mask layer 590 deposited as described in more detail with reference to FIG. 2. Also, shown are the etched desired patterns 595 in the first hard mask layer 590 defining the shape and position of each of the self-aligned contacts for the source, drain, and gate stack regions by stopping the etching on the deposited first doped oxide layer. The process of etching the desired patterns 595 for the self-aligned contacts has been described in more detail with reference to FIG. 2.

Figure 6:
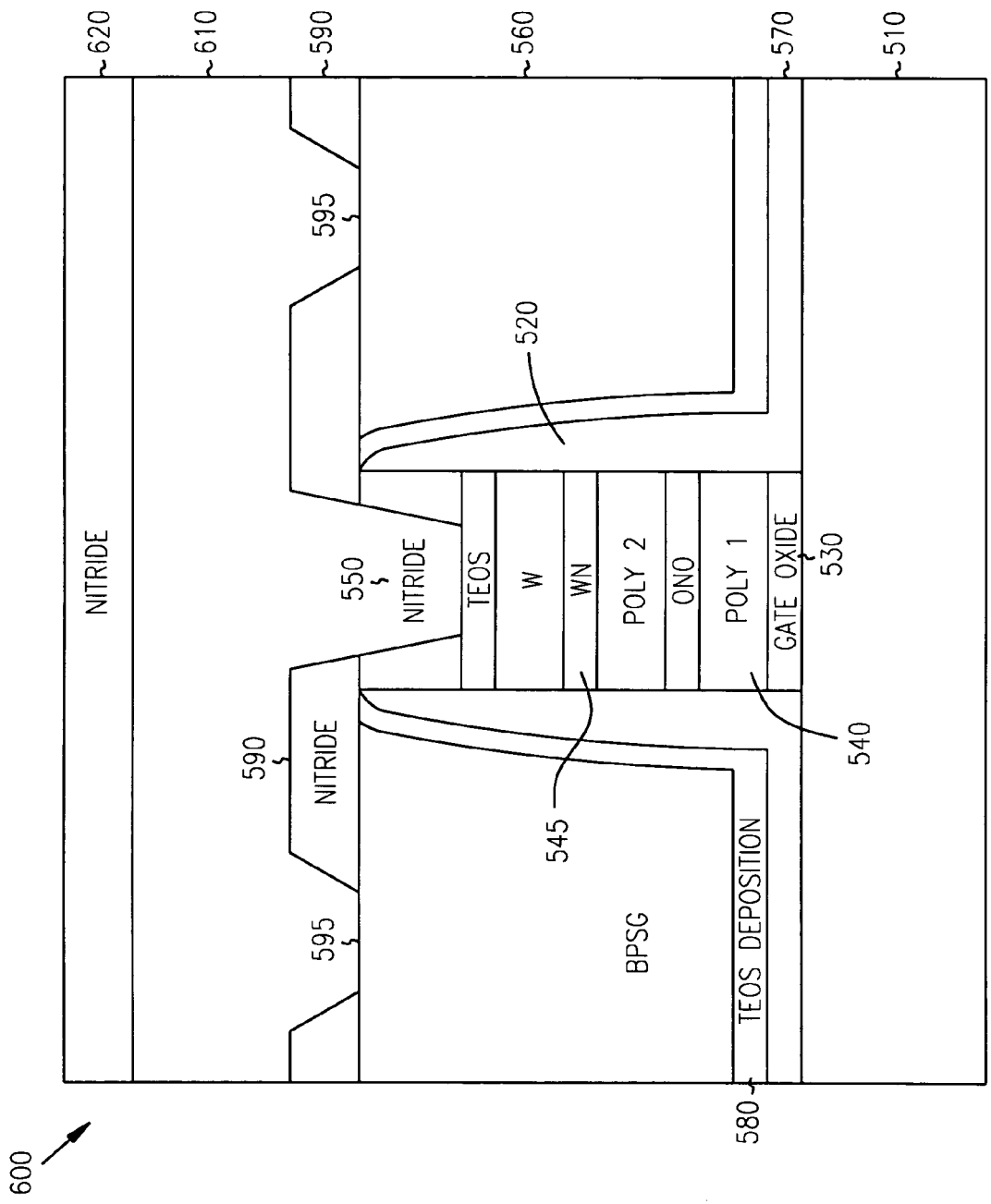
FIG. 6 is a cross-sectional view of a portion of the flash memory cell at a subsequent stage to that illustrated in FIG. 5, fabricated by using some of the steps illustrated in FIG. 3.

FIG. 6 illustrates memory cell structure 600 including the second doped oxide layer 610 deposited over the first hard mask layer 590. FIG. 6 further shows second hard mask layer 620 deposited over the second doped oxide layer 610. The process of depositing the second doped oxide layer 610 and the second hard mask layer 620 is described in more detail with reference to FIG. 3.

Figure 7:
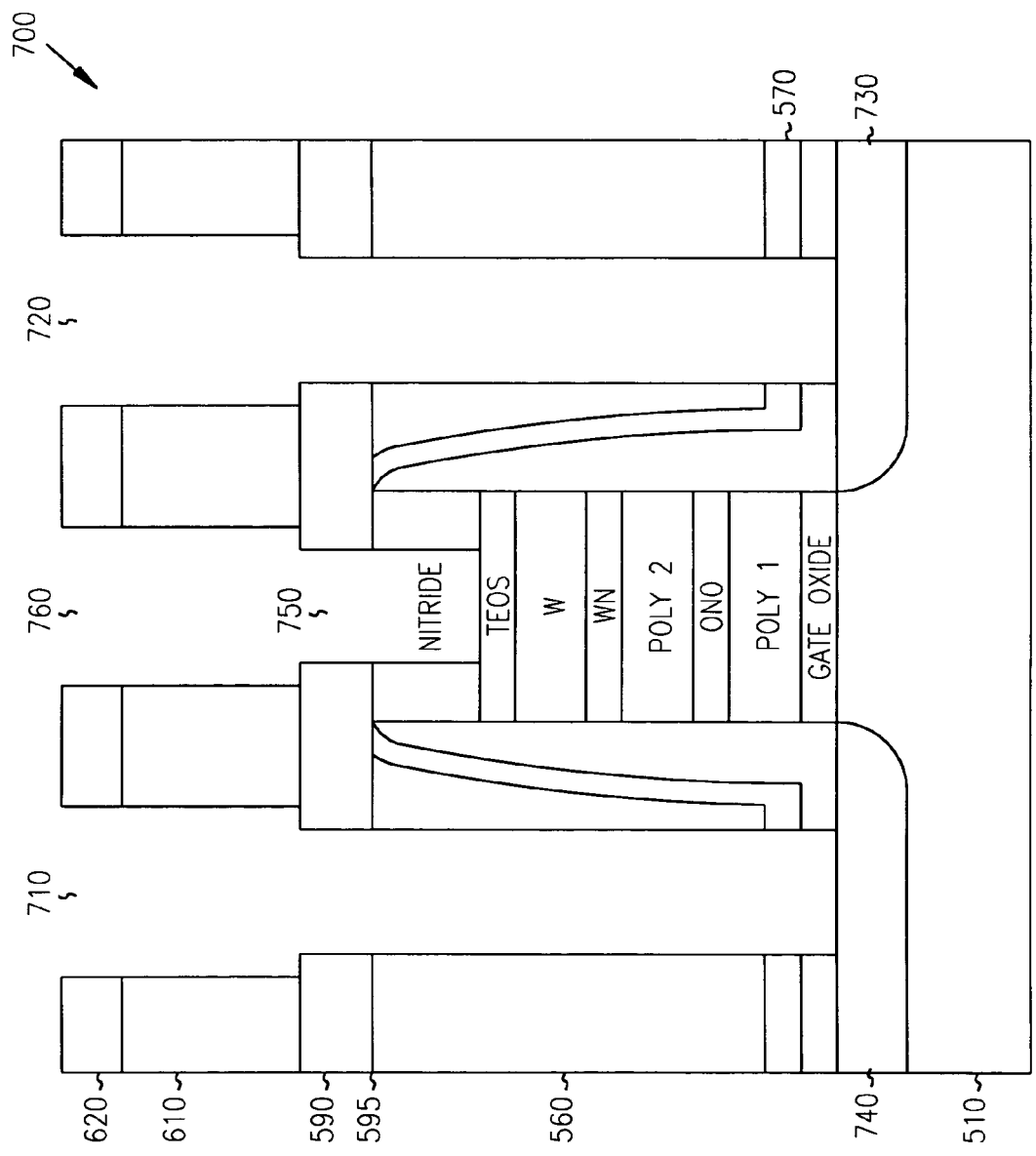
FIG. 7 is a cross-sectional view of a portion of the flash memory cell at a subsequent stage to that illustrated in FIG. 6, fabricated by using the remaining steps illustrated in FIG. 3.

FIG. 7 illustrates memory cell structure 700 including a formed self-aligned local area slotted via in the second doped oxide layer 610 and the second hard mask layer 620 that shunts all source junctions in the memory cell structure 700. Also, shown in FIG. 7 is formed discrete self-aligned drain extension 720 in the second doped oxide layer 610 and the second hard mask layer 620. Also, shown are formed discrete self-aligned drain, source, and gate contacts 730, 740, and 750 in the first doped oxide and hard mask layers 560 and 590, respectively. The formation of the desired etch patterns for slotted via 710, drain extension 720, and the source and drain contacts 730 and 740 are described in more detail with reference to FIGS. 2 and 3. It can be seen from FIG. 7 that the slotted via 710, drain extension 720, and source and drain contacts 730 and 740 can be plugged and filled with a conductive material in one single step.

The thickness of the doped oxide layers 560 and 610 shown in FIGS. 5 and 6 are approximately in the range of about 5000 to 18000 Angstroms. The thickness of the hard mask layers 590 and 620 is in the range of about 200 to 1500 Angstroms. The hard mask layers 590 and 620 shown in FIGS. 5 and 6 can be made from materials such as nitride. The contacts and the interconnects 710, 720, 730, and 740 can be plugged and filled with conductive materials, such as tungsten, aluminum, copper, titanium, tantalum, cobalt, molybdenum, tungsten silicide, titanium silicide, tantalum silicide, cobalt silicide, and/or molybdenum silicide.

Figure 8:
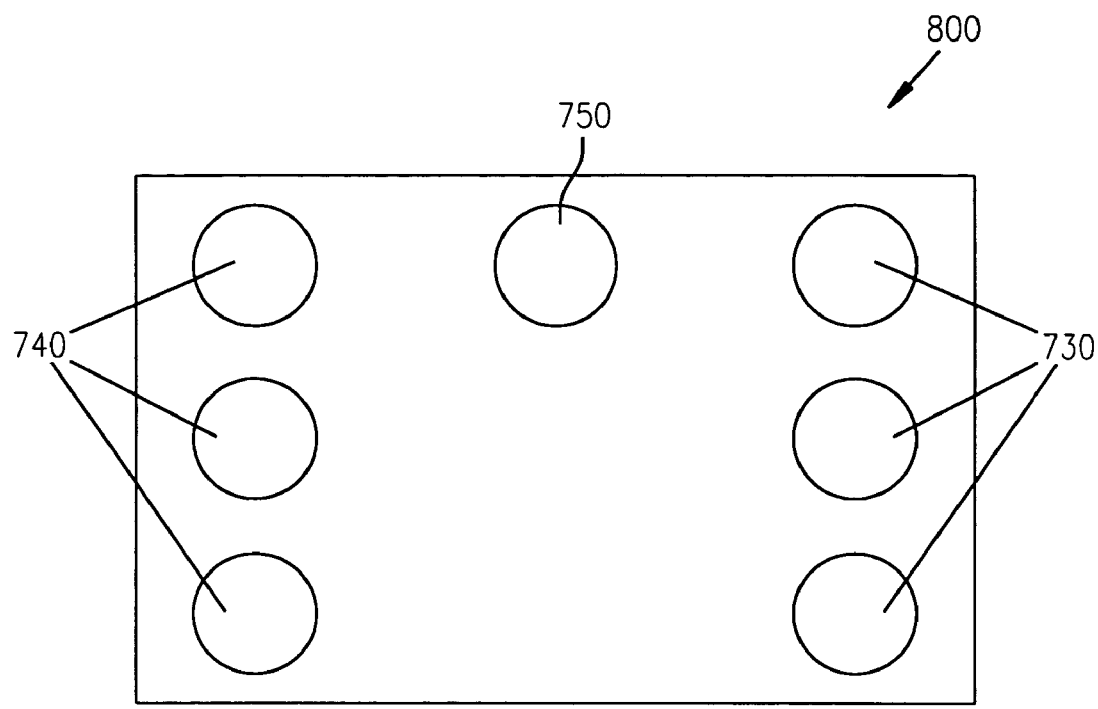
FIGS. 8 and 9 illustrate top views of etched patterns in the first and second hard mask layers.

FIG. 8 illustrates a top view 800 showing the formed discrete and substantially similarly sized self-aligned source, drain, and gate contacts 730, 740, and 750 in the first layer including the first doped oxide and hard mask layers 560 and 590. For the sake of more precise control on the contact to gate etch process, it may be required that we breakout the patterns for contact to source and drains from the pattern for gate contacts (two separate lithography masks) and then etch the hard mask for the gate contacts at a different time than that for the source and drain contacts. The process of forming desired etch patterns for the discrete source and drain contacts 730 and 740 is described in more detail with reference to FIG. 2. For illustrative purposes, the top view 800 only shows a few source and drain contacts 730 and 740. In addition, the top view 800 shows the gate stack 750 being in close proximity with the source and drain contacts 730 and 740. In general a memory cell structure has many more source and drain contacts, and the gate stack is not located this close to the source and drain contacts.

Figure 9:
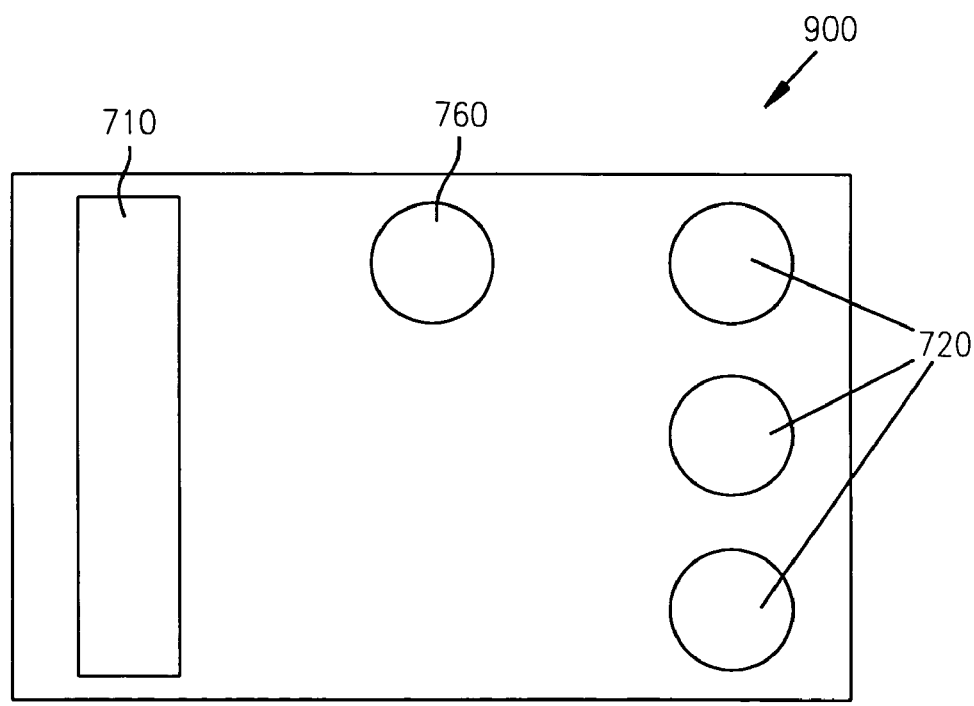

FIG. 9 illustrates a top view 900 showing slotted via 710, drain extension 720, and gate via 760 in the second doped oxide and hard mask layers 610 and 620, respectively over formed source, drain, and gate contacts 730, 740, and 760. The process of forming desired patterns for slotted via 710 and drain extension 720 is described in more detail with reference to FIG. 3.

Figure 10:
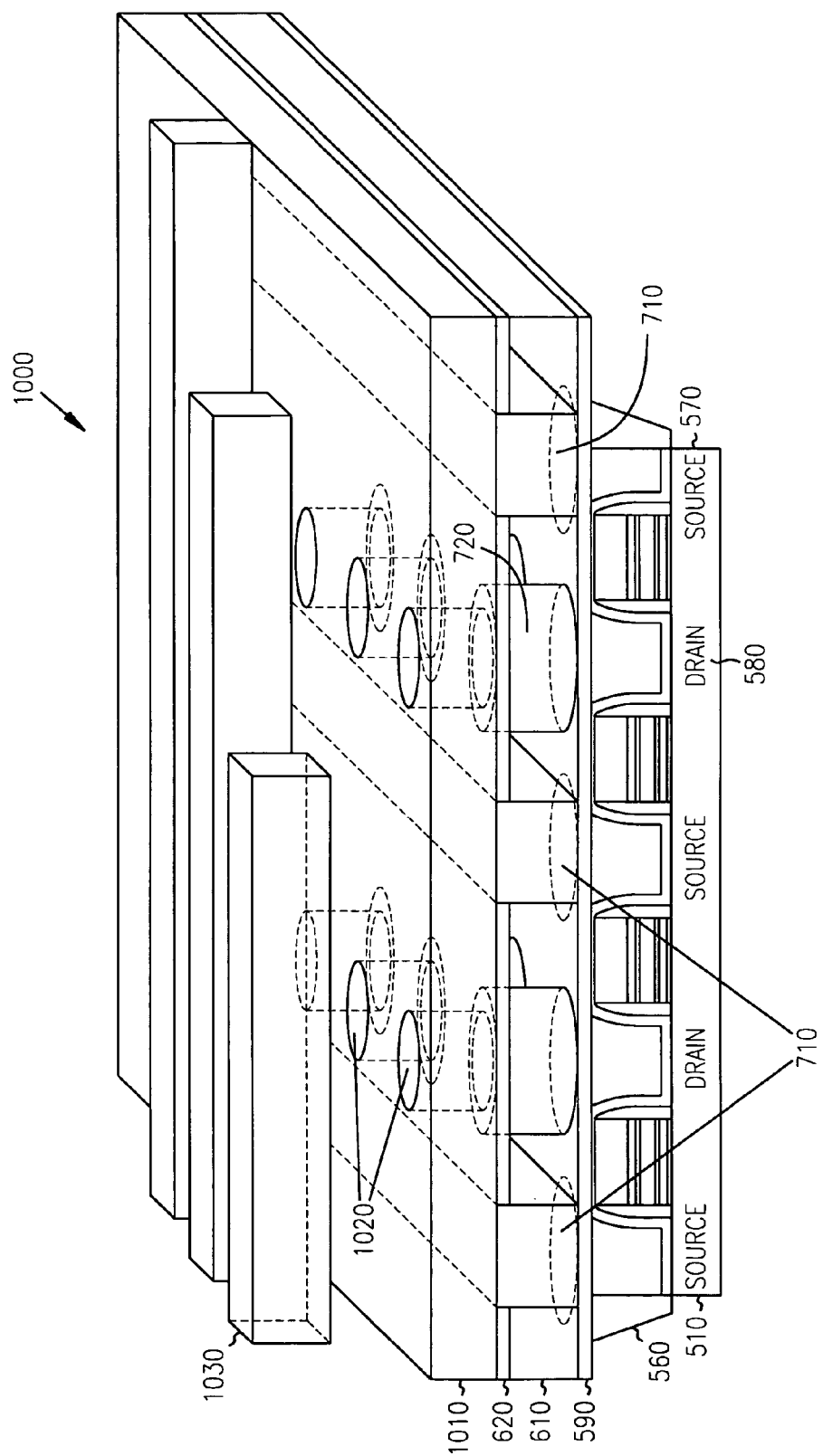
FIG. 10 is a perspective view of a memory cell array fabricated using the steps illustrated in FIGS. 1, 2, 3, and 4.

FIG. 10 shows formed memory cell array 1000 using the steps illustrated in FIGS. 2–4. Also, the memory cell array shown in FIG. 10 includes the various stages illustrated in FIGS. 5–7. In addition to what is shown in FIGS. 5–7, memory cell array 1000 further includes a third doped oxide layer 1010, discrete drain connections 1020 to establish connection with the exposed discrete drain extensions 720, and a first level metallization 1030 on the outer exposed third doped oxide layer 1010 to electrically connect all of the established discrete drain contacts in array 1000. The formed memory cell array can be a flash memory cell array, a memory circuit on a semiconductor substrate, and/or a logic circuit including an array of memory cells.

The fabrication technique used in forming memory cell structure 1000 using the various stages illustrated in FIGS. 5–9, includes forming discrete and self-aligned contacts to each of the drains in the memory cell array disposed on a semiconductor substrate 510. The technique further includes forming self-aligned local area interconnects 710 to form a common source region between each of the cells, within each of the rows in the array to reduce the possibility that the formed contacts will touch the gate structures of memory cell array 1000. This significantly reduces the chances of shorting the gate structures. Finally, the formed contacts 720, 730, and 740 and interconnects 710 are plugged and filled with a conductive material to form the memory cell array 1000 shown in FIG. 10.

The fabrication technique of the present invention uses self-aligned contact structures 720, 730, and 740 and local area interconnects 710 to relax contact-to-gate spacing requirements to reduce the cell size and to further enhance the robustness of the fabrication process of memory cell array 1000. The technique allows discrete and similarly sized contacts 730 and 740 (shown in FIG. 8) to form both the source and drain regions in a single step. This makes the SAC process more controllable and repeatable, thereby enhancing the robustness of the fabrication process.

The technique further forms a shunt layer for the source junctions and contact extensions for the drain contacts, and further allows for a self-aligned via-to-contact process. The advantage of using such local area interconnects 710 is that the source rail resistance is no longer dependant on the doping profile of the source junction. This allows doping of the source junction to be scaled back, leading to more aggressive scaling of the channel length. In addition, since the source rail resistance is greatly reduced, there is no longer a need to have a source contact for every 16 cells. The number of source contacts, per row within a block, can now be scaled back to only two: one contact at the right edge of each block and the other contact at the left edge of each block.

In addition, the technique requires only one doped oxide etch to form all SAC contacts 730 and 740 and non-SAC contacts 750, shunt layer and contact extensions 710, 720, and 760. In addition, the technique requires only one metal stack deposition and one CMP to fill all SAC and non-SAC contacts, the shunt layer, and the contact extensions as shown in FIG. 7. Due to a reduced contact-to-gate area (because of the use of SAC contact) and source junction scaling (reduced channel length due to the use of local area interconnect), a smaller flash cell/array is produced. Further, by combining the doped oxide etch and the single step metal deposition/CMP processes, costs are significantly lowered. This technique further results in improved wafer/die yield due to the formation of substantially similarly sized contacts, which results in a more controlled and repeatable SAC process.

Figure 11:
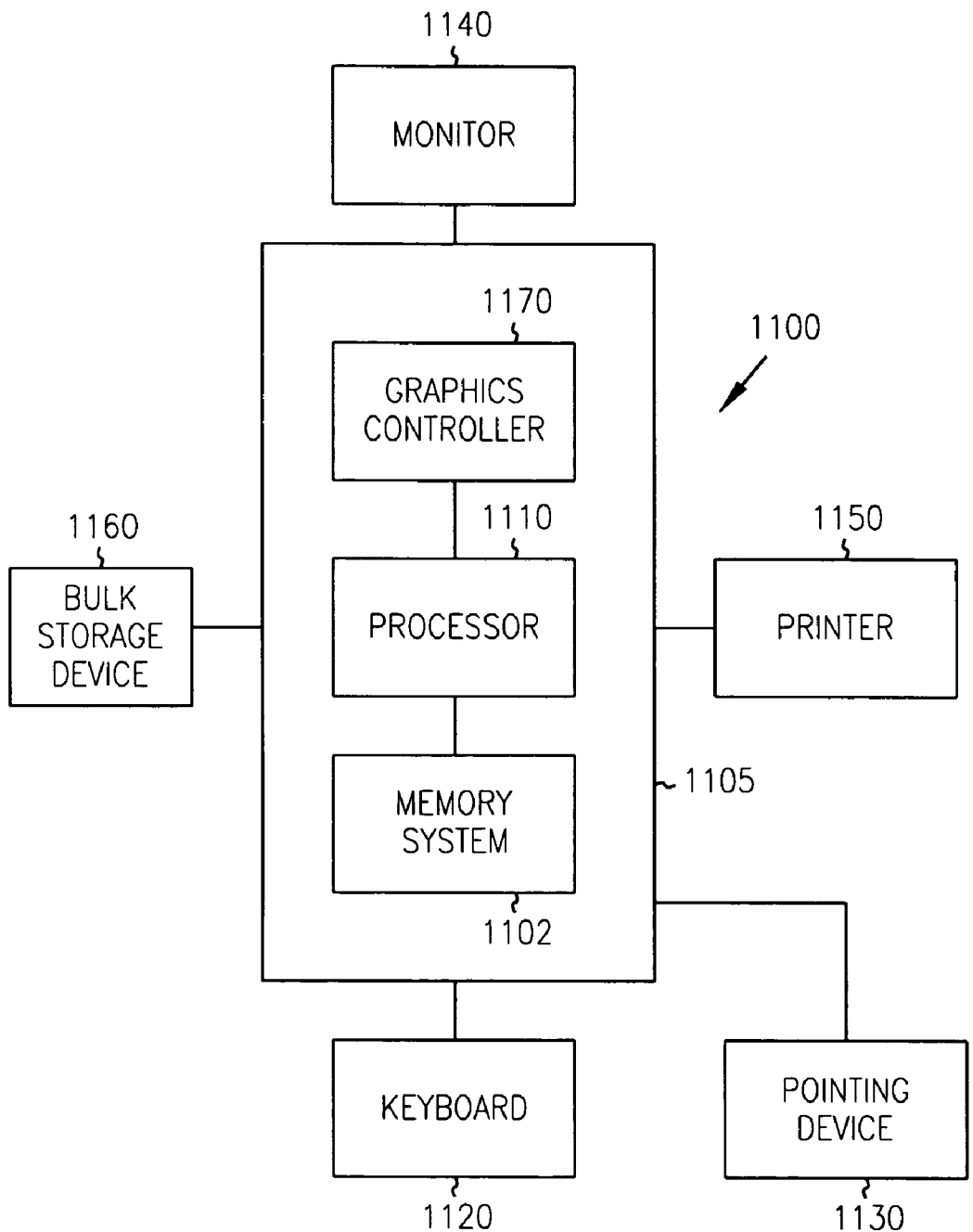
FIG. 11 is a block diagram of an exemplary computer system.

FIG. 11 is a block diagram of a system according to one embodiment of the present invention. Computer system 1100 contains a processor 1110 and a memory system 1102 housed in a computer unit 1105. Computer system 1100 is but one example of an electronic system containing another electronic system, e.g., memory system 1102, as a subcomponent. The memory system 1102 includes a memory device that includes a memory cell array as discussed in various embodiments of the present invention. Computer system 1100 optionally contains user interface components. These user interface components include a keyboard 1120, a pointing device 1130, a monitor 1140, a printer 1150, and a bulk storage device 1160. It will be appreciated that other components are often associated with computer system 1100 such as modems, device driver cards, additional storage devices, etc. It will further be appreciated that the processor 1110 and memory system 1102 of computer system 1100 can be incorporated on a single integrated circuit. Such single-package processing units reduce the communication time between the processor and the memory circuit. Any of these components of the system may contain a memory device that includes the multiple-mode output driver of the present invention. This is particularly true of a graphics subsystem 1170 of FIG. 11 utilizing SGRAM that includes the multiple-mode output driver as discussed in various embodiments of the present invention.

Figure 12:
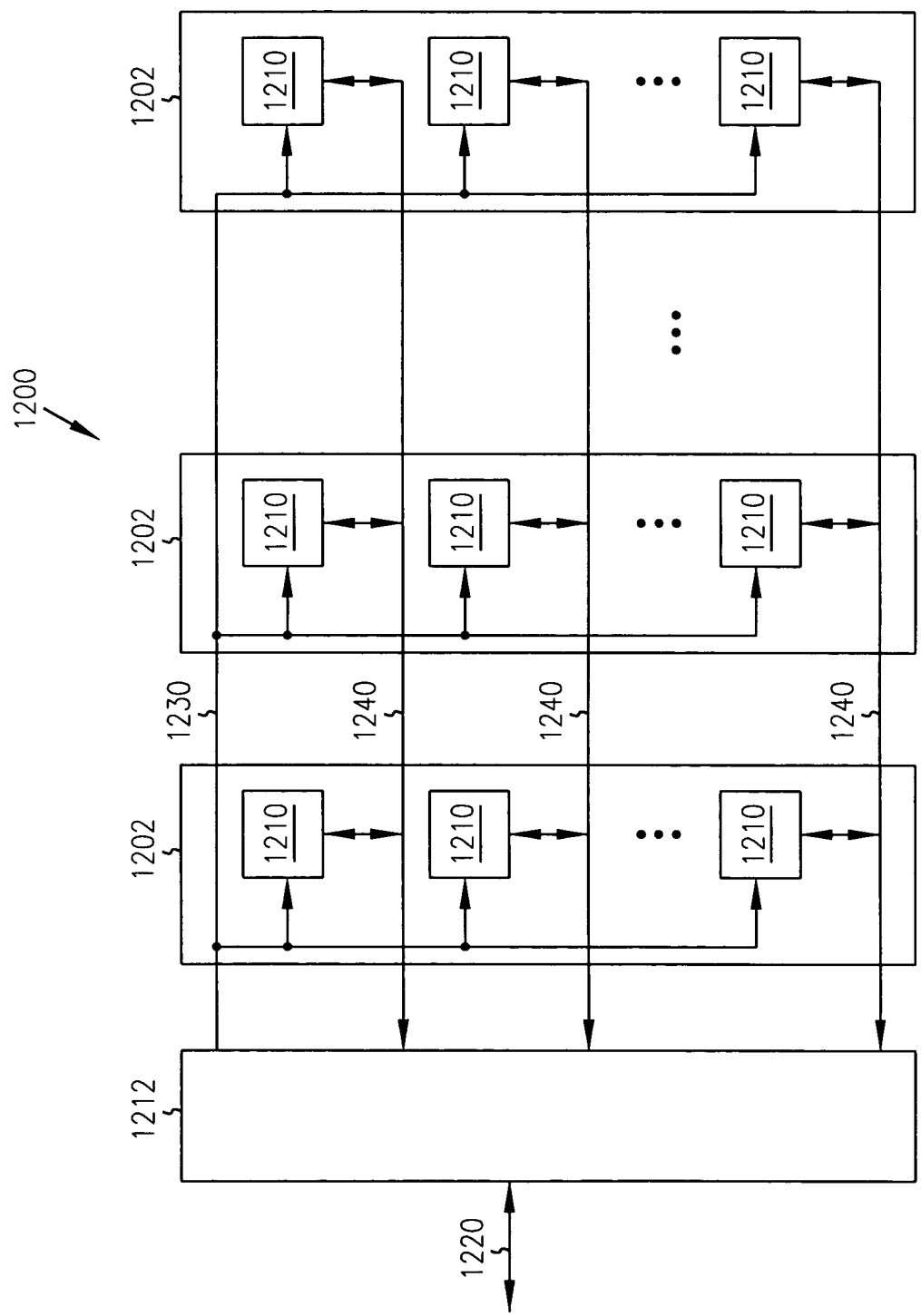
FIG. 12 is a block diagram of an exemplary memory system.

FIG. 12 is a block diagram of a system according to one embodiment of the present invention. Memory system 1200 contains one or more memory modules 1202 and a memory controller 1212. Each memory module 1202 includes at least one memory device 1210. Memory controller 1212 provides and controls a bidirectional interface between memory system 1200 and an external system bus 1220. Memory system 1200 accepts a command signal from the external bus 1220 and relays it to the one or more memory modules 1202 on a command link 1230. Memory system 1200 provides for data input and data output between the one or more memory modules 1202 and external system bus 1220 on data links 1240. At least one of the memory devices 1210 includes the memory cell array as discussed in various embodiments of the present invention.

Figure 13:
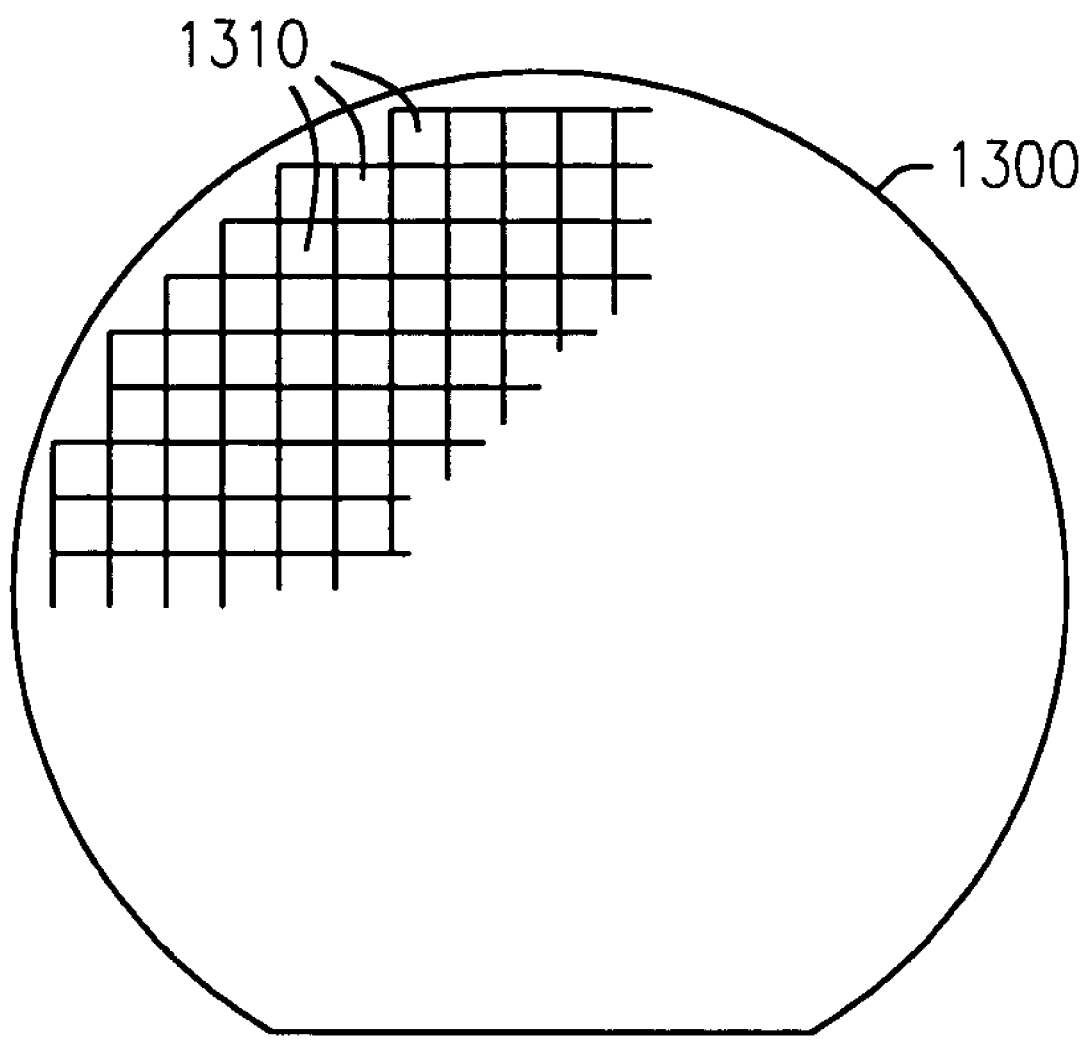
FIG. 13 is an elevation view of a substrate containing semiconductor dies.

With reference to FIG. 13, in one embodiment, a semiconductor die 1310 is produced from a silicon wafer 1300.

A die is an individual pattern, typically rectangular, on a substrate that contains circuitry to perform a specific function. A semiconductor wafer will typically contain a repeated pattern of such dies containing the same functionality. Die 1310 may contain circuitry for the memory device, as discussed above. Die 1310 may further contain additional circuitry to extend to such complex devices as a monolithic processor with multiple functionality. Die 1310 is typically packaged in a protective casing (not shown) with leads extending therefrom (not shown) providing access to the circuitry of the die for unilateral or bilateral communication and control.

The above description illustrates preferred embodiments, which achieve the features and advantages of the present invention. It is not intended that the present invention be limited to the illustrated embodiments. Modifications and substitutions to specific process conditions and structures can be made without departing from the spirit and scope of the present invention. Accordingly, the invention is not to be considered as being limited by the foregoing description and drawings, but is only limited by the scope of the appended claims.

What is claimed is:

1. An integrated memory circuit device, comprising:
   an array of memory cells, wherein each of the memory cells includes a stacked gate, a source, and a drain, wherein the array further includes source and drain junctions coupled to each source and drain, respectively, in the array;
   internal circuitry;
   a first layer including discrete and self-aligned source and drain metal contacts, wherein each of the drain contacts electrically couple to each of the drain junctions in the array;
   a second layer disposed over the first layer, wherein the second layer includes self-aligned local area interconnects, wherein each of the local area interconnects electrically shunt all of the source junctions through the formed source contacts in each row in the array to form the integrated memory circuit device; and
   wherein the array includes first and second hard mask layers made from nitride.

2. The device of claim 1, further comprising:
   a third layer disposed over the second layer, wherein the third layer includes discrete drain connections to electrically connect the exposed drain extensions in the second layer; and
   a first level metallization over the third layer to electrically connect all of the drain contacts in the array.

3. The device of claim 1, wherein the array includes doped oxide layers made from materials selected from the group consisting of BPSG, BSG, and PSG.

4. The device of claim 1, wherein the thickness of the doped oxide layers are in the range of about 5000 to 18000 Angstroms.

5. The device of claim 1, wherein the thickness of the hard mask layers is in the range of about 200 to 1500 Angstroms.

6. The device of claim 1, wherein the contacts and the interconnects are made from materials selected from the group consisting of tungsten, aluminum, copper, titanium, tantalum, cobalt, molybdenum, tungsten silicide, titanium silicide, tantalum silicide, cobalt silicide, and molybdenum silicide.

7. The device of claim 1, wherein the array of memory cells comprises:
   an array of flash memory cells.

8. A logic circuit, comprising:
   an array of memory cells, wherein each of the memory cells includes a stacked gate, a source, and a drain, wherein the array further includes source and drain junctions coupled to each source and drain, respectively, in the array;
   internal logic circuitry;
   discrete and self-aligned source and drain metal contacts, wherein each of the drain contacts electrically couple to each of the drain junctions in the array;
   self-aligned local area interconnects that electrically shunt all of the source junctions through the source contacts in each row in the array to form the array; and
   wherein the array includes first and second hard mask layers made from nitride.

9. The circuit of claim 8, further comprising:
   a third layer disposed over the second layer, wherein the third layer includes discrete drain connections to electrically connect the exposed drain extensions in the second layer; and
   a first level metallization over the third layer to electrically connect all of the drain contacts in the array.

10. The circuit of claim 8, wherein the array includes doped oxide layers made from materials selected from the group consisting of BPSG, BSG, and PSG.

11. The circuit of claim 10, wherein the thickness of the doped oxide layers are in the range of about 5000 to 18000 Angstroms.

12. The circuit of claim 8, wherein the thickness of the hard mask layers is in the range of about 200 to 1500 Angstroms.

13. The circuit of claim 8, wherein the contacts and the interconnects are made from materials selected from the group consisting of tungsten, aluminum, copper, titanium, tantalum, cobalt, molybdenum, tungsten silicide, titanium silicide, tantalum silicide, cobalt silicide, and molybdenum silicide.

14. The circuit of claim 8, wherein the array of memory cells comprises:
   an array of flash memory cells.

15. An integrated circuit, comprising:
   at least two transistors disposed upon a semiconductor surface having a first impurity type, each transistor including at least a first and a second diffused region having a second impurity type different from the first impurity type, and a conductive gate region disposed above the semiconductor surface and between the first and second diffused regions, and separated from the semiconductor surface by a gate insulator;
   a first insulator layer disposed over the at least two transistors including individual contact openings over the first diffused regions, individual contact openings over the second diffused regions, and individual contact openings over the gate regions;
   a second insulator layer disposed over the at least two transistors including slotted contact openings connecting selected ones of the first diffused regions, individual contact openings over the second diffused regions, and individual contact openings over the gate regions;
   a first conductive material filling all of the contact openings in the first and second insulator layers to electrically connect the first and second diffused regions and the conductive gate regions to a top surface of the second insulator layer;

a third insulator layer disposed over the at least two transistors including contact opening to selected portions of the first conductive material; and a second conductive material to electrically connect selected portions of the first conductive material to each other and to at least one external electrical device; and wherein the conductive gate region includes a first layer of doped polysilicon, an insulator layer disposed over the first layer of polysilicon, and a second layer of doped polysilicon disposed over the layer of insulator and the conductive gate to form a second conductive gate.

16. The integrated circuit of claim 15 further comprising the conductive gate and the second conductive gate form a flash memory transistor.

17. The integrated circuit of claim 15 further comprising the insulator layer includes an oxide-nitride-oxide layer.

18. The integrated circuit of claim 15 further comprising the conductive gate region includes a layer of a metal selected from at least one material from the group consisting of W, Al, Cu, Ti, Ta, Co, Mo, WSi, TiSi, TaSi, CoSi, and MoSi.

19. The integrated circuit of claim 15 further comprising the conductive gate region includes a first layer of doped polysilicon, an insulator layer disposed over the first layer of polysilicon, a second layer of doped polysilicon disposed over the insulator layer and the conductive gate to form a second conductive gate, a conductive barrier layer disposed over the second conductive gate, a layer of refractory metal disposed over the conductive barrier layer, and an insulator cap layer.

20. The integrated circuit of claim 19 further comprising the insulator layer disposed over the first layer of polysilicon includes an oxide-nitride-oxide layer.

21. The integrated circuit of claim 19 further comprising the layer of metal selected from at least one material from the group consisting of W, Al, Cu, Ti, Ta, Co, Mo, WSi, TiSi, TaSi, CoSi, and MoSi.

22. The integrated circuit of claim 19 further comprising the conductive gate region including at least one insulative side wall spacer.

23. An integrated circuit, comprising:

at least two transistors, each transistor including at least a source and a drain region in a semiconductor surface, and a gate disposed between the source and drain regions and separated from the semiconductor surface by a gate insulator;

a first insulator layer disposed over the transistors including individual contact openings over the source regions, individual contact openings over the drain regions, and individual contact openings over the gates;

a second insulator layer including slotted source openings connecting selected source regions, individual contact openings over the drain regions, and individual contact openings over the gates;

a first conductive material filling all of the contact openings in the first and second insulator layers to electrically connect the source and drain regions and the gates to a top surface of the second insulator layer; and the gate includes a first layer of doped polysilicon, an insulator layer, and a second layer of doped polysilicon gate to form a second conductive gate.

24. The integrated circuit of claim 23 further comprising the first and second layer of doped polysilicon gates form a flash memory transistor.

25. The integrated circuit of claim 23 further comprising the insulator layer includes an oxide-nitride-oxide layer.

26. The integrated circuit of claim 23 further comprising the gate includes a layer of a metal selected from at least one material from the group consisting of W, Al, Cu, Ti, Ta, Co, Mo, WSi, TiSi, TaSi, CoSi, and MoSi.

27. The integrated circuit of claim 23 further comprising the gate includes a first layer of doped polysilicon, an insulator layer, a second layer of doped polysilicon, a conductive barrier layer, a layer of refractory metal, and an insulator cap layer.

* * * * *

UNITED STATES PATENT AND TRADEMARK OFFICE
CERTIFICATE OF CORRECTION

| | | |
|---|---|---|
| PATENT NO. | : 7,148,547 B2 | Page 1 of 1 |
| APPLICATION NO. | : 10/929634 | |
| DATED | : December 12, 2006 | |
| INVENTOR(S) | : Rudeck | |

It is certified that error appears in the above-identified patent and that said Letters Patent is hereby corrected as shown below:

On the face page, in field (54), in "Title", in column 1, line 1, delete "SEMICONDUCTOR CONTACT DEVICE" and insert -- SEMICONDUCTOR CONTACT DEVICE AND METHOD --, therefor.

On the face page, in field (56), under "Other Publications", in column 2, lines 1-2, delete "Smiconductor" and insert -- Semiconductor --, therefor.

In column 1, line 1, delete "SEMICONDUCTOR CONTACT DEVICE" and insert -- SEMICONDUCTOR CONTACT DEVICE AND METHOD --, therefor.

In column 5, line 39, delete "Si $(OC_2H_5)_4$)" and insert -- Si$(OC_2H_5)_4$) --, therefor.

In column 7, line 60, delete "simiplicity" and insert -- simplicity --, therefor.

Signed and Sealed this

Twenty-seventh Day of March, 2007

JON W. DUDAS
*Director of the United States Patent and Trademark Office*